United States Patent [19]

Begas

[11] Patent Number: 4,686,459

[45] Date of Patent: Aug. 11, 1987

[54] LEVEL INDICATOR

[75] Inventor: Henk W. A. Begas, Eindhoven, Netherlands

[73] Assignee: U.S. Philips Corporation, New York, N.Y.

[21] Appl. No.: 776,729

[22] Filed: Sep. 16, 1985

[30] Foreign Application Priority Data

Sep. 25, 1984 [NL] Netherlands ............ 8402918

[51] Int. Cl.$^4$ ............................................. G01R 15/10
[52] U.S. Cl. ........................................ 324/132; 381/58
[58] Field of Search .................. 324/96, 102, 103 P, 324/140 D, 132; 307/351, 492; 328/55, 161, 145; 381/56, 58; 364/582, 715, 722; 340/753, 754, 749, 734; 329/106

[56] References Cited

U.S. PATENT DOCUMENTS

| 3,569,953 | 3/1971 | Shuda et al. | 340/347 AD |
|---|---|---|---|
| 3,603,746 | 9/1971 | Heick et al. | 324/140 D |
| 3,828,255 | 8/1974 | Schuon | 324/132 |
| 4,011,509 | 3/1977 | Edwards | 328/145 |
| 4,113,997 | 9/1978 | Horna | 324/132 |
| 4,149,120 | 4/1979 | Richter | 324/132 |
| 4,165,508 | 8/1979 | Barter | 307/351 |
| 4,190,825 | 2/1980 | De Puy et al. | 340/347 AD |

FOREIGN PATENT DOCUMENTS

| 0549807 | 5/1977 | U.S.S.R. | 364/582 |
|---|---|---|---|
| 0901932 | 2/1982 | U.S.S.R. | 324/140 D |

Primary Examiner—Reinhard J. Eisenzopf
Assistant Examiner—W. Burns
Attorney, Agent, or Firm—Thomas A. Briody; Jack Oisher; William J. Streeter

[57] ABSTRACT

A level indicator for displaying the decibel values of digital samples of an analog signal with respect to a reference value, each sample having a predetermined number of bits. The indicator comprises a shift register having a smaller bit capacity than the number of bits in the digital signals and for which, a resolution of 2dB, comprises three series-connected flip-flops. The digital signals are applied to the input of the first flip-flop and, together with the outputs of all the flip-flops, to a combinational logic circuit. The output of the last flip-flop is connected to a read-enable circuit. As each bit of a digital signal is shifted into the shift register, the logic circuit generates a logic signal from combination of the output signals of the flip-flops and such digital signal bit, the value of such logic signal indicating how many times a predetermined decibel amount should be applied to the value stored in the shift register in order to attenuate it to the reference value. An adder adds the value of such logic signal to the value of the logic signal previously produced by the logic circuit in response to the preceding bit of the digital signal, and the resulting sum is stored in a memory. When the number of digital signal bits in the shift register reaches the capacity of the shift register, the sum then in the memory is transferred to a read-out device by the read-enable circuit.

7 Claims, 6 Drawing Figures

| No | $m_{14}$ $m_{13}$ $m_{12}$ | $m_{11}$ $m_{10}$ $m_9$ $m_8$ | $m_7$ $m_6$ $m_5$ $m_4$ | $m_3$ $m_2$ $m_1$ $m_0$ | -dB |
|---|---|---|---|---|---|
| a | 0  0  0 | 1  1  1  1 | X  X  X  X | X  X  X  X | $(3 \times 6) + 0 = 18$ |
| b | 0  0  0 | 1  1  1  0 | X  X  X  X | X  X  X  X | $(3 \times 6) + 0 = 18$ |
| c | 0  0  0 | 1  1  0  1 | X  X  X  X | X  X  X  X | $(3 \times 6) + 2 = 20$ |
| d | 0  0  0 | 1  1  0  0 | X  X  X  X | X  X  X  X | $(3 \times 6) + 2 = 20$ |
| e | 0  0  0 | 1  0  1  1 | X  X  X  X | X  X  X  X | $(3 \times 6) + 2 = 20$ |
| f | 0  0  0 | 1  0  1  0 | X  X  X  X | X  X  X  X | $(3 \times 6) + 4 = 22$ |
| g | 0  0  0 | 1  0  0  1 | X  X  X  X | X  X  X  X | $(3 \times 6) + 4 = 22$ |
| h | 0  0  0 | 1  0  0  0 | X  X  X  X | X  X  X  X | $(3 \times 6) + 6 = 24$ |

| No | $Q_C$ $Q_B$ $Q_A$ M | $B_1$ $B_0$ | A' |
|---|---|---|---|
| a | . . . 0 | 1 1 | 1 1 |
|   | . . 0 0 | 1 1 | 1 1 0 |
|   | . 0 0 0 | 1 1 | 1 0 0 1 |
|   | 0 0 0 1 | 0 0 | 1 0 0 1 |
|   | 0 0 1 1 | 0 0 | 1 0 0 1 |
|   | 0 1 1 1 | 0 0 | 1 0 0 1 |
|   | 1 1 1 1 | 0 0 | 1 0 0 1 |
| b | 0 0 0 1 | 0 0 | 1 0 0 1 |
|   | 0 0 1 1 | 0 0 | 1 0 0 1 |
|   | 0 1 1 1 | 0 0 | 1 0 0 1 |
|   | 1 1 1 0 | 0 0 | 1 0 0 1 |
| c | 0 0 0 1 | 0 0 | 1 0 0 1 |
|   | 0 0 1 1 | 0 0 | 1 0 0 1 |
|   | 0 1 1 0 | 0 1 | 1 0 1 0 |
|   | 1 1 0 1 | 0 0 | 1 0 1 0 |
| d | 0 0 0 1 | 0 0 | 1 0 0 1 |
|   | 0 0 1 1 | 0 0 | 1 0 0 1 |
|   | 0 1 1 0 | 0 1 | 1 0 1 0 |
|   | 1 1 0 0 | 0 0 | 1 0 1 0 |
| e | 0 0 0 1 | 0 0 | 1 0 0 1 |
|   | 0 0 1 0 | 0 1 | 1 0 1 0 |
|   | 0 1 0 1 | 0 0 | 1 0 1 0 |
|   | 1 0 1 1 | 0 0 | 1 0 1 0 |
| f | 0 0 0 1 | 0 0 | 1 0 0 1 |
|   | 0 0 1 0 | 0 1 | 1 0 1 0 |
|   | 0 1 0 1 | 0 0 | 1 0 1 0 |
|   | 1 0 1 0 | 0 1 | 1 0 1 1 |
| g | 0 0 0 1 | 0 0 | 1 0 0 1 |
|   | 0 0 1 0 | 0 1 | 1 0 1 0 |
|   | 0 1 0 0 | 0 1 | 1 0 1 1 |
|   | 1 0 0 1 | 0 0 | 1 0 1 1 |
| h | 0 0 0 1 | 0 0 | 1 0 0 1 |
|   | 0 0 1 0 | 0 1 | 1 0 1 0 |
|   | 0 1 0 0 | 0 1 | 1 0 1 1 |
|   | 1 0 0 0 | 0 1 | 1 1 0 0 |

LEVEL INDICATOR

BACKGROUND OF THE INVENTION

1. Field of the Invention

The invention relates to a level indicator for indicating the decibels the ratio between the instantaneous value and an extreme value of a sample of an analog signal, which values are given by binary coded digital signals of a fixed number of bits, which level indicator comprises a digital signal converting circuit, which for each digital signal supplies a drive signal to a read-out device equipped with a display device.

Such a level indicator for indicating the magnitude of a digital signal may be employed, for example, for adjusting the recording level in a digital audio recorder and in digital mastering equipment for producing compact digital discs.

2. Description of the Related Art

Such a level indicator is known from U.S. Pat. No. 3,952,247. In this indicator the samples of the analog signal are applied to a parallel analog-to-digital converter, which converts the analog signal into a parallel digital signal. This parallel signal is applied to a decoding device, whose outputs are connected to driver circuits for display elements constituted by light-emitting diodes. The ratio between the instantaneous value and the maximum value of the signal in decibels can be read from a scale adjacent these diodes. For each value of the digital signal the decoding device generates a signal on an appropriate output, which signal is further processed by the driver circuits to drive a column of display elements corresponding to the magnitude of the relevant digital signal. The driver circuits comprise facilities which prolong the display time for brief peaks in signal strength, so that these peaks are more easily discernible.

A disadvantage of this known level indicator is that the decoding device must decode a large number of levels to obtain a large display range with a high resolution, which in combination with the associated driver circuits renders the indicator rather complex with a large number of components. Another drawback is that the known level indicator does not provide a decibel-linear readout over the entire range.

SUMMARY OF THE INVENTION

Therefore, it is an object of the invention to provide a simple level indicator with a decibel-linear read-out. According to the invention a level indicator of the type defined in the opening paragraph is characterized in that the digital signal converting circuit comprises:
  a first shift register which has a hit capacity smaller than the number of in the digital signal and which comprises an input to which the digital signal is applied serially, the most significant bit first, and which comprises an output for each of the bits,
  a combinational logic network which, each time that a digital signal is shifted into the shift register, derives a binary coded signal from the signal on the input and the signals on the outputs of the shift register for the consecutive contents of the shift register, which binary coded signal indicates how many times the extreme value of said ratio should be incremented with a predetermined decibel value,
  an adder for adding the binary value of the binary coded signal from the logic network to the preceding binary value thereof and transferring the sum of these values to a memory, and
  a read-enable circuit for enabling the value in the memory to be read out by the read-out device after a number of bits equal to the bit capacity of the shift register and consecutive to the bit having a logic value equal to the extreme value of the signal has been shifted into the shift register.

In the level indicator in accordance with the invention the bits of each digital signal, except for the polarity bit, are applied serially, the most significant bit first, to a first shift register. For a level indicator with a resolution of 2 dB this shift register may be, for example, a 3-bit shift register. Each bit from the beginning of a digital signal having a logic value, for example logic "0", opposite to the logic value of bits for the extreme value, for example the maximum value, of the signal, yields an attenuation of 6 dB relative to this maximum signal. When each such bit is loaded into the register the combination network generates a binary number having a decimal value of three. This number is the number of times that an amount of −2 dB should be added to the maximum value of the ratio, which is 0 dB. The consecutive binary numbers from the combination network are each time added and the resulting sum is stored in a memory. For the three bits following the first logic "1" in the signal the combination network, depending on the values of these bits, generates a binary number having a decimal value of zero or one, so that these bits together determine whether 0, −2, −4 or −6 dB should be added to the result obtained so far. After these three bits have been shifted consecutively into the shift register, the read-enable circuit supplies a signal which enables the contents of the memory to be transferred to the read-out device. The read-out device then displays the ratio in decibels between the instantaneous value and the maximum value of the digital signal.

An embodiment of the invention is characterized in that the read-out device comprises:
  a display device comprising a plurality of display elements,
  a second shift register comprising outputs for supplying drive signals to the display elements of the display device,
  an up/down counter whose binary-coded count corresponds to the contents of the second shift register,
  a comparator for comparing the number from the memory with the count of the counter and for supplying a drive signal as long as the count of the counter is higher than the number from the memory,
  a first clock for supplying a first clock signal of a first frequency when the comparator supplies a drive signal, which first clock signal decrements the counter and modifies the contents of the second shift register in a first direction, and
  a second clock for supplying a second clock signal of a second frequency lower than the first frequency in the absence of the first clock signal, which second clock signal increments the counter and modifies the contents of the second shift register in a second direction opposite to the first direction. For a digital signal which is larger than the preceding digital signal the display device rapidly displays the new value of the ratio owing to the comparatively high frequency of the first clock and for a smaller digital signal the display device falls back only slowly to the new value owing to the lower frequency of the second clock. As a result of this, peaks remain visible for a longer time, so that the signal can be better adjusted for these peaks. The time during which these peaks are displayed can be adjusted if, in accordance with a further embodiment, the frequency of the second clock signal is variable.

It is to be noted that prolonging the display time for peaks in a signal is known per se from U.S. Pat. No. 3,952,247. However, the manner in which this is achieved is entirely different from that in accordance with the present invention.

Yet another embodiment is characterized in that the display elements of the display device are light-emitting diodes, whose anodes are connected to a positive voltage and whose cathodes are connected to the outputs of the second shift register. By connecting the LEDs directly to the outputs of the shift register the display elements can be driven very simply.

Still another embodiment of the invention may be characterized in that the read-out device comprises:
a digital-to-analog converter, which converts the value of the binary number in the memory into an analog signal, and
a moving-coil instrument with a dB linear scale, to which the analog signal from the digital-to-analog converter is applied.

BRIEF DESCRIPTION OF THE DRAWINGS

Embodiments of the invention will now be described in more detail, by way of example, with reference to the accompanying drawings, in which:

FIG. 1 shows the basic diagram of a level indicator in accordance with the invention, FIGS. 2 and 3 show two tables to explain the operation of the circuit shown in FIG. 1.

DESCRIPTION OF THE PREFERRED EMBODIMENTS

Figures 1, 2:
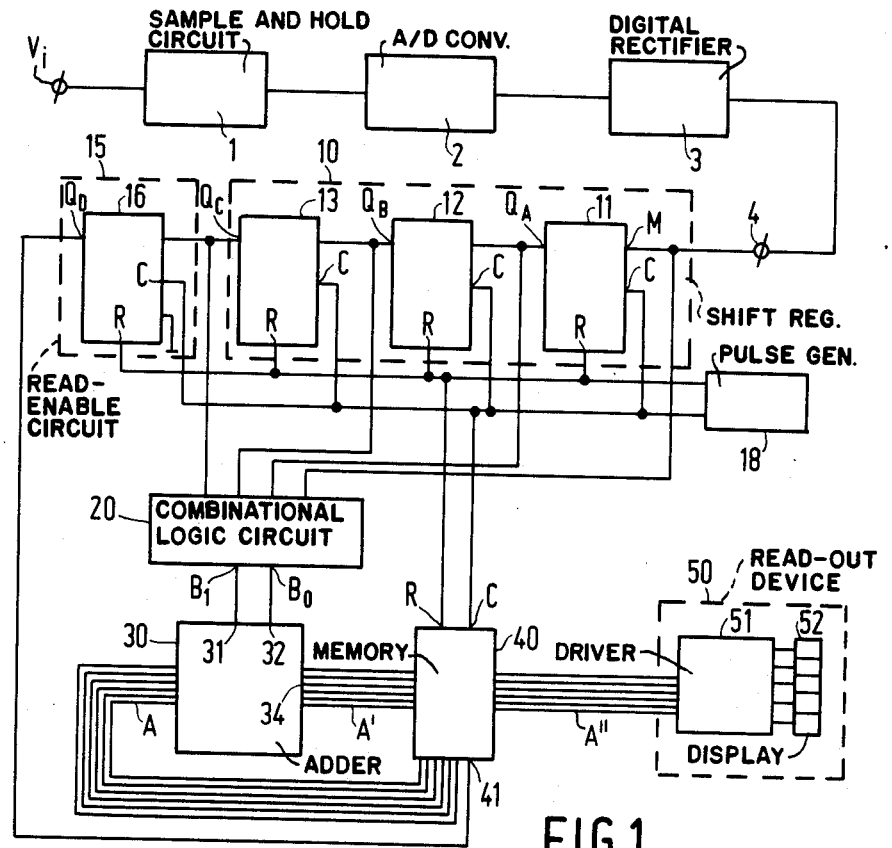

FIG. 1 shows the basic diagram of a level indicator in accordance with the invention. An analog signal $V_i$ is sampled by means of a sample-and-hold circuit 1, after which the samples are converted into digital signals by means of an analog-to-digital converter 2, which digital signals are subsequently rectified and are cleared of their polarity bits in a digital rectifier 3. The rectified signals are applied serially to the input 4 of the actual level indicator. This indicator comprises a shift register 10, which in the present example comprises three D-type flip-flops 11, 12 and 13 arranged in series and having outputs $Q_A$, $Q_B$ and $Q_C$, respectively. The flip-flops 11, 12 and 13 each also comprise a clock input C and a reset input R. The clock pulses and reset pulses are supplied by pulse generating means 18. The output $Q_C$ of the flip-flop 13 is connected to the input of a read-enable circuit 15, which in the present example comprises a JK flip-flop 16 whose K-input is earthed and which further comprises a clock input C and a reset input R. The M-input of the flip-flop 11 and the outputs $Q_A$, $Q_B$ A and $Q_C$ of the flip-flops 11, 12 and 13 are connected to the inputs of a combination network 20, whose outputs $B_1$ and $B_0$ are connected to the inputs 31 and 32 of an adder 30. This adder 30 adds the number $B = B_1 B_0$ on the inputs 31 and 32 to a number A obtained from a memory 40 and applies the result $A' = A + B$ of this addition to this memory 40 via an output 34. This memory 40 may comprise, for example, a number of flip-flop circuits arranged in parallel. In addition to a clock input C and a reset input R this memory 40 comprises an input 41 which is connected to the output $Q_D$ of the read-enable circuit 15. If a signal appears on this input 41 the contents of the memory 40 is transferred to a read-out device 50, which comprises a driver circuit 51 and a display device 52.

The operation of the level indicator will be described for a 15-bit rectified digital signal, whose magnitude is indicated with a resolution of 2 dB over a range of 70 dB. Assuming that all the bits have the logic value "1" for the maximum value of the signal, each bit of the logic value "0" preceding the first bit of the logic value "1" represents an attenuation of 6 dB relative to the maximum value. The three bits following the first bit of the logic value "1" determine whether a further attenuation of 0, −2, −4 or −6 dB should be added to the result already obtained. The table of FIG. 2 gives the total attenuation in decibels for a number of digital signals. The three most significant bits $m_{14}$, $m_{13}$, $m_{12}$ of these signals each have a logic value "0" and together represent an attenuation of 18 dB. In these signals the bit $m_{11}$ is always the first bit of the logic value "1". The possible values of the three next bits $m_{10}$, $m_9$ and $m_8$ are given by the signals in the table. The logic values of the other bits are irrelevant because these bits are not used in the computation. Since only three bits after the first logic "1" are utilized in the computation, a certain error will occur. As the resolution selected for the level indicator is 2 dB, this error does not lead to excessive deviation in the values to be displayed.

For each of the signals in the table of FIG. 2 the table in FIG. 3 gives the values appearing on the inputs and outputs M, $Q_A$, $Q_B$ and $Q_C$ of the shift register 10, the outputs $B_1$, $B_0$ of the combination circuit 20 and the contents $A'$ of the memory 40 for each bit of the digital signal applied to the shift register 10. What happens with the first three bits of the logic value "0" is indicated for the first signal only.

Before a signal is applied to the input 4 of the level indicator all the flip-flops are reset by signals on their reset inputs. To enable the first three bits of the signals of logic value "0" to be distinguished from the reset state, the latter state has been marked with dots. The first logic "0" on the input M of the flip-flop 11 denotes an attenuation of 6B relative to the maximum value of the signal, which corresponds to three steps of −2 dB. For this bit the combination network 20 therefore generates the binary number $B_1 B_0 = 11$ on its outputs, which corresponds to the decimal value 3. This number is stored in the memory 40. For the second logic "0" the number $B_1 B_0 = 11$ appears again on the outputs of the combination network 20, which number is added to the number $A = 11$ from the memory by means of the adder 30, after which the sum $A' = 110$ is stored in the memory 40. The same happens for the third logic "0" resulting in the sum $A' = 1001$ in memory 40. For the next four bits of the logic value "1" the combination network 20 each time generates the number $B_1 B_0 = 00$ on its outputs, so that after these four bits the memory still contains the number $A' = 1001$. Thus, this number indicates how many times, i.e., 9 times, an amount of 2 dB should be subtracted from the maximum value of 0 dB. Upon the next clock pulse which loads the next bit into the shift register 10 the flip-flop 16 is set by the logic "1" on the output of the flip-flop 13, so that a signal of the logic value "1" appears on the output $Q_D$ of the read-enable circuit 15. This signal is applied to the memory 40, so that the contents of this memory are transferred to the readout device 50. The number from the memory 40 is processed by means of the driver circuit 51 to form drive signals for the display elements of the display device 52, which drive such a column of display elements that the value assigned to the uppermost display element corresponds to the number from the memory 40. For the other numbers in column 3 it is possible to derive in a similar way what happens when the consecutive bits are loaded into the shift register.

It follows from the table in FIG. 3 that the following relationships are valid between the logic signals $B_1$ and $B_0$ on the outputs of the combination network 20 and the logic signals on the inputs and the outputs M, $Q_A$, $Q_B$ and $Q_C$;

$$B_0 = M.Q_B + M.Q_C \text{ and } B_1 = M.Q_A.Q_B.Q_C$$

Figure 4:
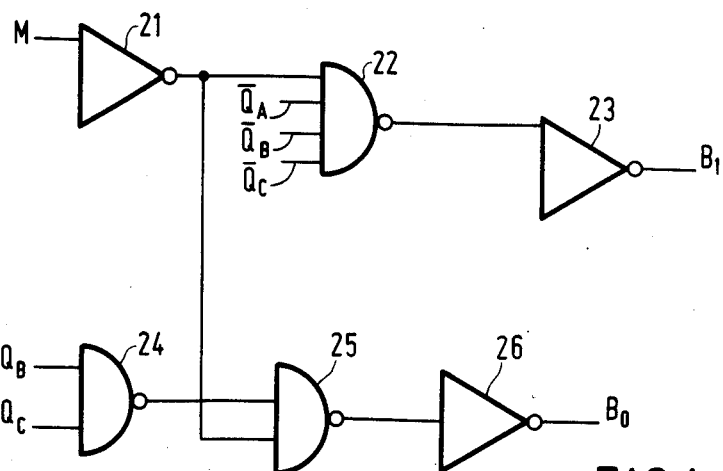
FIG. 4 shows an example of a combination network used in the circuit shown in FIG. 1.

The validity of these relationships can be ascertained simply by drawing up the truth table for these relationships. FIG. 4 shows an example of a combination network by means of which the above relationships can be established. The number $B_1$ is generated by inverting the signal M in an inverter 21 and applying the inverted signal together with the signals on the complementary outputs of the flip-flops 11, 12 and 13 to a NAND-gate 2, whose output signal is inverted with an inverter 23. The number $B_0$ is generated by applying the signals $Q_B$ and $Q_C$ to a NAND-gate 24 whose output signal together with the signal M which has been inverted by the inverter 2 to a NAND-gate 25, whose output signal is subsequently inverted in an inverter 26. It is to be noted that the combination network may be constructed in many other ways.

Further, it follows from the table in FIG. 3 that the smallest signal for which the read-enable circuit 15 generates a signal which causes the contents of the memory 40 to be transferred to the read-out device 50 is 000 0000 0000 1000. If the resolution is 2 dB it follows that the range of the level indicator would be 72 dB. However, the −72 dB value is also valid for smaller signals up to and including 000 0000 0000 0110. However, for these smaller signals the memory 40 is no longer allowed to transfer its contents by the read-enable circuit 15 but by a clock pulse which precedes every new signal. For practical reasons the range of the level indicator is therefore limited to 70 dB. It is to be noted that the level indicator may also be employed for signals other than 15-bit signals. With the present construction and for a resolution of 2 dB the range of the level indicator is generally (6N-26), dB, where N is the number of bits of the digital signal. The resolution of the level indicator is not limited to 2 dB. It is also possible to select another resolution, the smallest resolution being dictated by the number of bits of the first shift register. This number of bits is not limited to three as in the present example, but is arbitrary provided that it is smaller than the number of bits of the digital signal.

Figure 5:
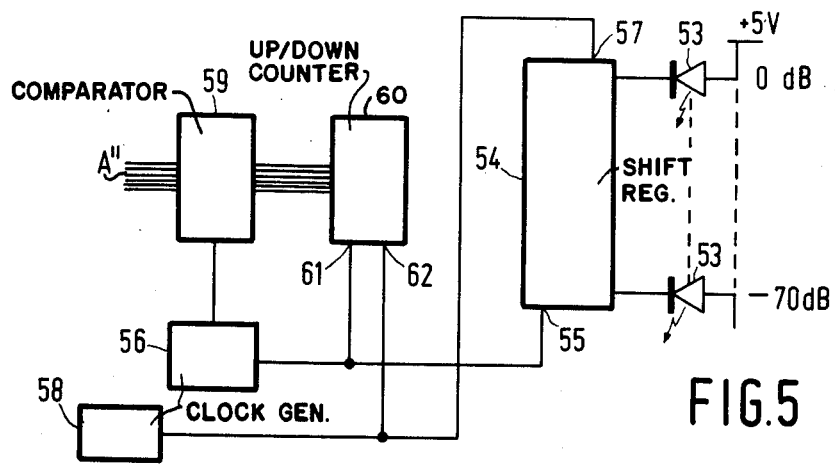
FIG. 5 shows a first example of a read-out device which may be used in the circuit shown in FIG. 1.

For a 70 dB range with a resolution of 2 dB, as in the above example, the number of display elements of the display device 52 should be 36. The display device 52 may be an active display device or a passive display device. The manner in which the driver circuit 51 processes the signal from the memory 40 into a drive signal for the display elements is irrelevant for the level indicator in accordance with the invention, so that this circuit may be constructed in many other ways. However, FIG. 5 shows a read-out device 50 which simply enables brief peaks in the magnitude of the digital signal to be displayed for a prolonged time. Thus, the magnitude of the digital signal can be observed better, so that for example the analog-to-digital converter for generating the digital signal introduces less distortion. The display device now comprises a column of light-emitting diodes 53, whose anodes are connected to a positive voltage of 5 V and whose cathodes are connected to the outputs of a shift register 54. A scale graduation from 0 to −70 dB has been provided adjacent the diodes. At the lower end of the shift register 54 there is provided an input 55, which is connected to a clock 56, which supplies clock pulses with a high frequency, for example 6 MHz. For each clock pulse a logic "0" is loaded into the shift register 54, each time causing the number of active light-emitting diodes to increase by one. At the upper end the shift register 54 comprises an input 57 which is connected to a clock 58, which supplies clock pulses of a lower frequency, for example 20 Hz. For each clock pulse from this clock a logic "1" loaded into the shift register 54, so that the number of active light-emitting diodes 53 each time decreases by one.

Further, the read-out device comprises a comparator 59, which compares the number A" from the memory 40 (see FIG. 1) with a number from an up/down counter 60. This counter 60 has an input 61, which is connected to the clock 56, and an input 62, which is connected to the clock 58. When a clock pulse appears on the input 61 the count of the counter is decremented by one and when a clock pulse appears on the input 62 the count of this counter is incremented by one. For the first digital signal the up/down counter 60 is set to a binary value equal to the number of display elements. As long as the number from the memory 40 is smaller than the count of the counter 60, the comparator 59 supplies a signal which causes the clock 56 to supply clock pulses. As a result of the high frequency of these pulses the number of activated light-emitting diodes 53 in the column increases rapidly and at the same time the count of the counter 60 is decremented rapidly. thus, the display device will rapidly display the new reading. The second clock 58 is inoperative as long as the clock 56 supplies clock pulses.

If the following digital signals decrease and consequently the number in the memory 40 is larger than the count of the counter 60, the number of active light-emitting diodes 53 in the column decreases slowly as a result of the frequency of the clock pulses from the second clock 58. These clock pulses at the same time cause the count of the counter 60 to be incremented until the number from the memory 40 is again smaller than the count and the clock 56 is re-started. In this way brief pulses remain visible for a longer time, enabling the magnitude of the digital signal to be adjusted better. If the frequency of the clock pulses from the clock 58 is variable, the time during which these brief pulses are visible can be adjusted.

Figure 6:
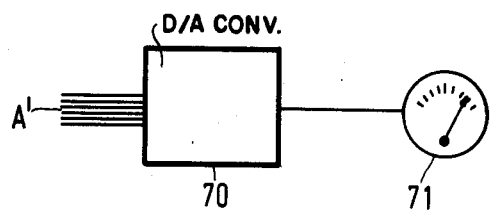
FIG. 6 shows a second example of a read-out device which may be used in the circuit shown in FIG. 1.

FIG. 6 shows another example of a read-out device 50 for use in the level indicator shown in FIG. 1. The read-out device comprises a digital-to-analog converter 70, which converts the number A" from the memory 40 (see FIG. 1) into an analog signal. The digital-to-analog converter 70 in the example of an indicator with a range of 70 dB and a resolution of 2 dB may be a 6-bit D/A converter. The analog signal from the digital-to-analog converter 70 is applied to a moving-coil instrument 71 with a dB-linear scale, which indicates the value of the analog signal.

The invention is not limited to the embodiment described above. Within the scope of the invention many modifications are conceivable to those skilled in the art. Further, the level indicator may operate in conjunction with an identical second indicator if the digital signal is a stereo audio signal.

What is claimed is:

1. A level indicator for displaying in decibels values of successive digital samples of an analog signal with respect to a reference value, such samples being binary coded digital signals having a predetermined number of bits representing logic values relative to such reference value, which level indicator comprises a read-out device and a digital signal converting circuit having an input to which such digital signals are serially applied and which, in response to each such digital input signal, causes the read-out device to display the decibel value thereof; characterized in that such digital signal converting circuit comprises:
   a first shift register having an input at which the successive digital input signals are serially received, the most significant bit of each such signal being first, and having a storage capacity less than said predetermined number of bits, such shift register further having a plurality of outputs at which it produces digital output signals respectively corresponding to the binary values of the digital input signal bits stored therein;
   a combinational logic circuit coupled to said shift register to combine each successive digital input signal bit thereto with the digital output signals then being produced thereby so as to derive a binary logic signal signifying a number of increments of a predetermined decibel value for attenuating a digital value of the bits then stored in the shift register to said reference value;
   digital adding means coupled to said logic circuit for deriving successive binary sums of the logic signals produced thereby in response to successive bits of each digital input signal, such adding means comprising a memory in which each such binary sum is stored;
   and a read-enable circuit coupled to said memory for transferring the binary sum stored in said memory to said read-out device each time the number of bits of a digital input signal stored in said shift register, and which immediately succeed a bit of such signal having the same logic value as said reference value, reaches the capacity of said shift register.

2. A level indicator as claimed in claim 1, characterized in that the read-out device comprises:
   a display device comprising a plurality of display elements,
   a second shift register comprising outputs for supplying drive signals to the display elements of the display device,
   an up/down counter whose binary-coded count corresponds to the contents of the second shift register,
   a comparator for comparing the binary sum stored in said memory with the count of said counter and for supplying a control signal as long as said count is higher than said binary sum,
   a first clock for supplying a first clock signal of a first frequency in response to the control signal supplied by the comparator, which first clock signal decrements the counter and modifies the contents of the second shift register in a first direction, and
   a second clock for supplying a second clock signal of a second frequency lower than the first frequency in the absence of the first clock signal, which second clock signal increments the counter and modifies the contents of the second shift register in a second direction opposite to the first direction.

3. A level indicator as claimed in claim 2, characterized in that the frequency of the second clock signal is variable.

4. A level indicator as claimed in claim 2, characterized in that the display elements of the display device are light-emitting diodes, whose anodes are connected to a positve voltage and whose cathodes are connected to the outputs of the second shift register.

5. A level indicator as claimed in claim 1, characterized in that the read-out device comprises:
   a digital-to-analog converter, which converts the value of the binary sum stored in the memory into an analog signal, and
   a moving-coil instrument with a dB-linear scale, to which the analog signal from the digital-to-analog converter is applied.

6. A level indicator as claimed in claim 1, characterized in that the read-enable circuit comprises a flip-flop whose input is connected to that output of the first shift register which corresponds to the first bit of the digital input signal bits stored therein.

7. A level indicator as claimed in claim 1, characterized in that the first shift register has a capacity of three bits and said predetermined decibel value is minus two.

* * * * *